United States Patent [19]

Sakai et al.

[11] Patent Number: 4,563,807
[45] Date of Patent: Jan. 14, 1986

[54] METHOD FOR MAKING SEMICONDUCTOR DEVICE UTILIZING MOLECULAR BEAM EPITAXY TO FORM THE EMITTER LAYERS

[75] Inventors: Hiroyuki Sakai, Moriguchi; Toyoki Takemoto, Yawata; Kenji Kawakita; Tsutomu Fujita, both of Hirakata; Atsuko Akiyama, Kobe, all of Japan

[73] Assignee: Matsushita Electric Industrial Co., Ltd., Kadoma, Japan

[21] Appl. No.: 596,592

[22] Filed: Apr. 4, 1984

[30] Foreign Application Priority Data

Apr. 6, 1983 [JP] Japan ................................. 58-60145

[51] Int. Cl.$^4$ ................... H01L 21/225; H01L 21/285
[52] U.S. Cl. ........................... 29/591; 29/576 E; 29/578; 148/174; 148/175; 148/188; 148/DIG. 123; 148/DIG. 124; 148/DIG. 169; 357/34; 357/59
[58] Field of Search ..... 148/174, 175, 188, DIG. 123, 148/DIG. 124, DIG. 169; 29/576 E, 578, 591; 357/34, 59

[56] References Cited

U.S. PATENT DOCUMENTS

| | | | |
|---|---|---|---|
| 3,460,007 | 8/1969 | Scott | 148/174 X |
| 3,488,235 | 1/1970 | Walczak et al. | 148/175 X |
| 3,753,807 | 8/1973 | Hoare et al. | 148/188 |
| 3,904,450 | 9/1975 | Evans et al. | 29/578 X |
| 3,915,765 | 10/1975 | Cho et al. | 148/175 |
| 4,063,967 | 12/1977 | Graul et al. | 148/174 X |
| 4,127,931 | 12/1978 | Shiba | 29/578 X |
| 4,190,949 | 3/1980 | Ikeda et al. | 148/175 X |
| 4,226,648 | 10/1980 | Goodwin et al. | 148/175 |
| 4,428,111 | 1/1984 | Swartz | 29/576 E X |
| 4,484,388 | 11/1984 | Iwasaki | 29/576 E X |

OTHER PUBLICATIONS

Swartz et al., "Uncompensated . . . Bipolar Transistor . . . Molecular Beam. . . " IEEE Electron Dev. Ltn., vol. EDL-2, No. 11, Nov. 1981, pp. 293-295.

*Primary Examiner*—William G. Saba
*Attorney, Agent, or Firm*—Cushman, Darby & Cushman

[57] ABSTRACT

Semiconductor device, such as bipolar transistor, is made by molecular beam epitaxy, wherein a emitter layer (27) and overriding contact regions (28) of polycrystalline silicon are grown continuously on a silicon substrate (23+26) without breaking high vacuum, thus eliminating the adverse interface of natural oxide film under the polycrystalline silicon layer (28) and the adverse donor-acceptor compensation while attaining a well controlled $h_{FE}$ and enabling a shallow emitter junction.

12 Claims, 21 Drawing Figures

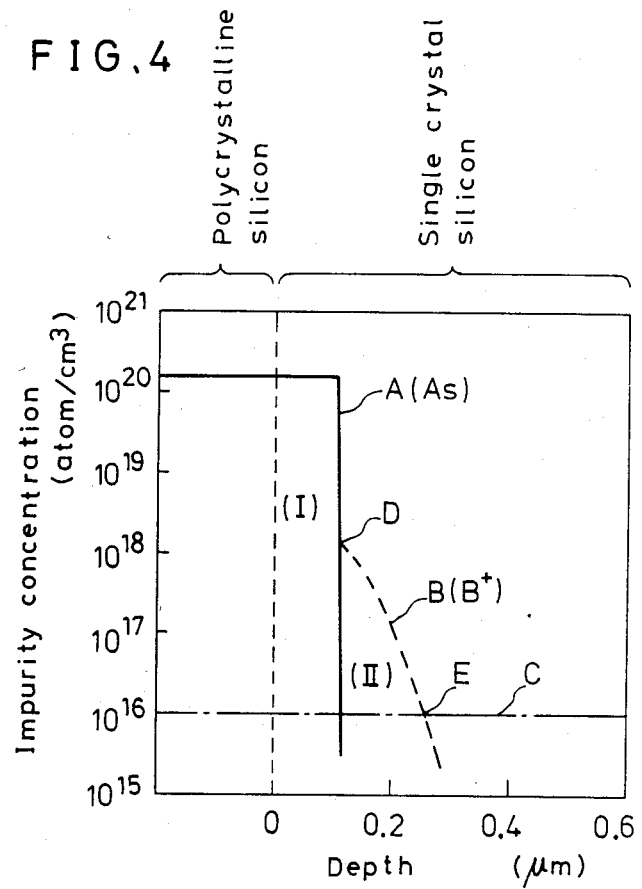

METHOD FOR MAKING SEMICONDUCTOR DEVICE UTILIZING MOLECULAR BEAM EPITAXY TO FORM THE EMITTER LAYERS

BACKGROUND OF THE INVENTION

1. Field of the Invention

The present invention relates generally to methods for making semiconductor devices, and particularly to methods for making bipolar semiconductor devices of high integration and high speed operation with high controllability of the current amplification factor $h_{FE}$.

2. Description of the Prior Art

In recent years, semiconductor devices are developing in a direction of more and more high speed operation and high integration, and for that reason studies and proposals are made on the technology of forming shallow junctions. Especially in bipolar semiconductor devices, the technology of forming the shallow base junction is a key point in deciding characteristic of the transistor.

FIG. 1 is a sectional elevation view of an essential part of a bipolar transistor utilizing polycrystalline silicon as its emitter electrode. In FIG. 1, there is formed a collector region 1 of an n-type epitaxial layer, a base layer 2 of a p-type diffused region, and an emitter region 6 of an n-conductivity type diffused region are formed. Oxide layer 3 has an opening 301 wherein a polycrystalline silicon layer 4 is formed as emitter electrode. The base layer 2 is formed by ion-implantation of boron. Thereafter, the opening 301 is bored by a photolithographic method, and therein the polycrystalline silicon layer 4 is then As ions are implanted in the polycrystalline silicon layer 4 by ion implantation. Thereafter, by a heat treatment, the As ions are driven into the base region 2 to form the n-type emitter region 6. The above-mentioned polycrystalline silicon layer 4 is usually formed by a CVD (chemical vapour deposition) method. In such a CVD method of forming the polycrystalline silicon, the wafer is heated to a temperature of 400°–700° C., and accordingly a thin oxide film 5 is formed with a thickness of several tens Å to several hundred Å at the interface between the surface of the emitter region 6 and the bottom of the polycrystalline silicon layer 4. The formation of the natural oxide film 5 cannot be avoided in the usual CVD method.

In the above-mentioned conventional method, use of the polycrystalline silicon layer 4 as the electrode is based on the following four reasons: Reason 1 is that by using As implanted in the polycrystalline silicon layer 4 as a diffusion source, and by thermally driving it into the single crystal silicon wafer, the emitter junction can be made shallower than the case where As ions are directly implanted into the single crystalline silicon. Reason 2 is that though making the emitter region requires high dose of As, such a high dose implantation is received by the polycrystalline silicon layer 4 and accordingly the underlying emitter region 6 is not subject to serious defects by the high dose ion-implantation. Reason 3 is that when the Al electrode is formed in the final stage, even though the Al reacts with the Si polycrystalline silicon layer 4, the reaction does not go through the single crystal emitter region 6 but remains there. Therefore, an undesirable emitter-base short-circuit or emitter-collector short circuit is prevented. Reason 4 is that in the polycrystalline silicon layer 4, the lifetimes of holes from the base region 2 is short, and accordingly $h_{FE}$ can be made high.

FIG. 2 shows concentration profile of impurity of the conventional bipolar transistor of the example of FIG. 1. The abscissa is graduated by depth from the interface between the polycrystalline silicon layer 4 and the single crystalline wafer surface, and the ordinate is graduated by concentration of the impurity. In the graph, curve A (solid curve) shows the profile of emitter impurity, curve B (dotted line) shows the profile of the base impurity and curve C (chain line curve) shows profile of collector impurity. In the graph, point D represents the emitter junction, point E the base junction. As shown in FIG. 2, As-ions in the polycrystalline silicon has very small mobility, and thereby hardly contributes to the operation of the bipolar transistor. Donor (As-ions) actually operating in the emitter region is given as difference between As-ions and B⁺-ions, which are compensating each other. That is, the As-ions in the region I can only contribute as donors to the emitter action. Similarly, B⁺-ions contributing to the operation of the base as acceptor is the total impurity concentration of B⁺ in the II region. The As-ions and B⁺-ions in the region III compensate each other and thereby do not contribute to the action of the bipolar transistor.

In order to improve the high speed and high integration of the transistor, it is necessary to make the emitter width junction and base junction shallower and also the base width depth should be thin. But as shown in FIG. 2, as the junctions become shallower the effect of the compensation between the donor (As) and acceptor (B⁺) increases more and more, thereby the total amount of acting donors in the emitter decreases. Accordingly, the total number of electrons reaching from the emitter through the base to the collector decreases, thereby deteriorating the injection efficiency, and hence, the current amplification factor $h_{FE}$. However, as far as the present technology of diffusion and ion implantation are used, the compensation effect of the donor and acceptor in the emitter cannot be avoided. Therefore, in order to make a very shallow junction, another technology must be introduced.

Furthermore, according to the present chemical vapour deposition method, when a polycrystalline silicon layer is formed, the natural oxide film is inevitably formed at the interface between the underlying single crystalline silicon wafer and the polycrystalline silicon layer. Therefore, when As is thermally treated to be driven into the underlying single crystalline silicon from the polycrystalline silicon layer used as a diffusion source, the natural oxide film adversely influences the As-driving, thereby making the impurity distribution unstable. Hence, the current amplification factor $h_{FE}$ becomes unstable, thus, controllability of $h_{FE}$ in manufacturing becomes poor. Especially when the natural oxide film is thick, the As-ions undesirably pile up at the interface between the single crystalline silicon and polycrystalline silicon as shown by dotted circle F in FIG. 2. This results in such problems that the impurity As-ions hardly diffuse into the single crystalline silicon, and making the dispersion of $h_{FE}$ large, hence makes the production yield low.

SUMMARY OF THE INVENTION

The purpose of the present invention is to provide an improved method for making a semiconductor device which has high integration and high speed operation with high production yield by utilizing the novel use of molecular beam epitaxy without interruption of high vacuum, in manufacturing the semiconductor device. This avoids the formation of an undesirable oxide film between the underlying single crystalline semiconductor the overriding polycrystalline semiconductor or amorphous semiconductor layer. Especially in a bipolar transistor, after forming base region and subsequent to forming of the emitter region and polycrystalline silicon layer by the molecular beam epitaxy method, a shallow junction can be formed with good controllability without forming natural oxide film at the interface between the underlying emitter region and the overriding polycrystalline silicon layer. Furthermore, as a result of the improved configuration, there is no compensation effect between the donor and acceptor in the emitter region, contrasted to the conventional emitter region made by diffusion method. Accordingly, the efficiency of injection of carriers from the emitter to the base can be improved, thereby enabling production of a semiconductor device of high speed and high integration, and highly improved controllability of the current amplification factor $h_{FE}$ in mass production Furthermore, the present invention enables forming of all the base region, emitter region and the overriding polycrystalline silicon layer by molecular beam epitaxy, and a semiconductor device having very shallow emitter junction and base junction for high speed operation can be manufactured with high integration. Also the current amplification factor $h_{FE}$ can be controlled, very well.

The method for making such a semiconductor device comprises at least steps of forming a first emitter layer of single-crystalline semiconductor, forming a second emitter layer of polycrystalline or amorphous semiconductor on said first layer, said first and second emitter layers are continuously formed by means of molecular beam epitaxy without forming an interface of oxide film therebetween.

forming an anti-oxidation layer on said second emitter layer, forming a pattern by etching said first and second emitter layers, and forming an oxide layer for at least surrounding side portions of said first and second emitter layers by use of said anti-oxidation layer as a mask.

BRIEF DESCRIPTION OF THE DRAWINGS

FIG. 4 is a graph of the impurity concentration profile of the semiconductor device of FIG. 3(a).

DESCRIPTION OF PREFERRED EMBODIMENTS

[Embodiment 1]

Figure 1:
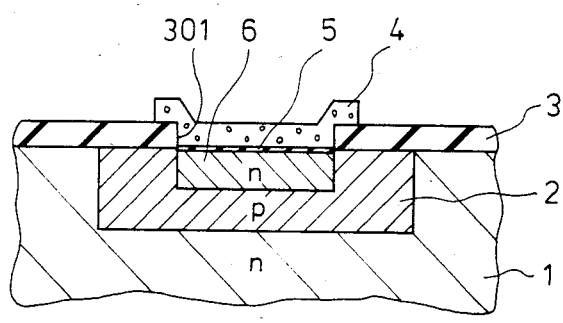
FIG. 1 is the sectional view of an essential part of the conventional bipolar transistor.
Figure 2:
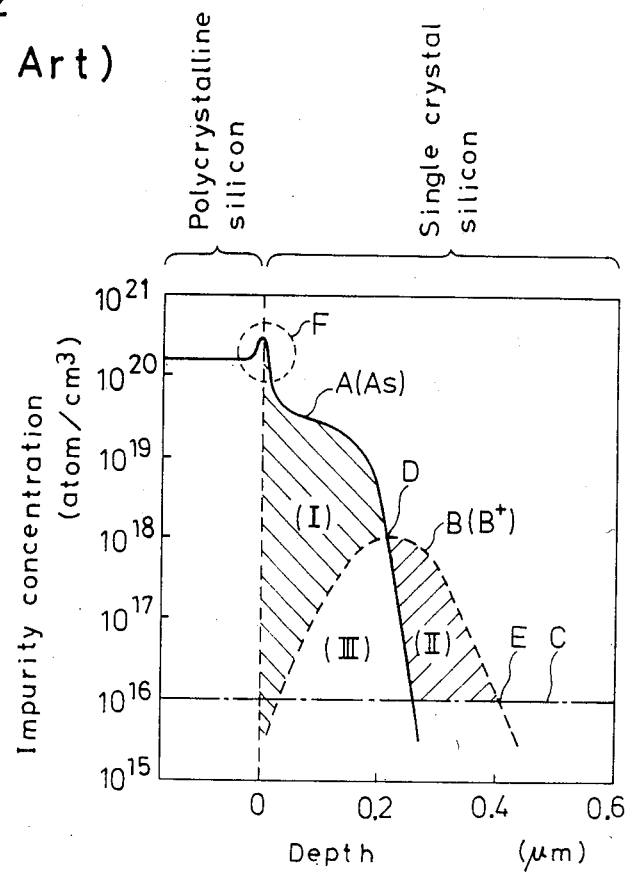
FIG. 2 is the graph of the impurity concentration profile of the bipolar transistor of FIG. 1.
Figure 3A:
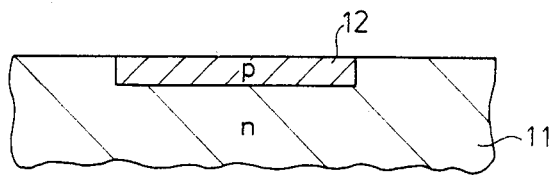
FIG. 3(a), FIG. 3(b), FIG. 3(c) and FIG. 3(d) are sectional elevation views of the essential part of a semiconductor device showing manufacturing steps embodying the present invention.

FIG. 3(a) through FIG. 3(d) show manufacturing steps of a fundamental embodiment of the present invention. As shown in FIG. 3(a), an n-type epitaxial layer 11 is formed as a collector by known epitaxial methods. A base layer 12 is formed by known methods such as, an ion implantation method.

Figure 3B:
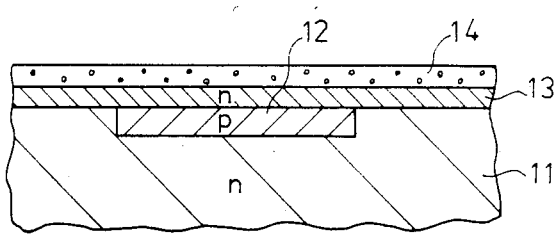

Thereafter, keeping the heating furnace in a high vacuum, molecular beam epitaxy is carried out in the high vacuum of $10^{-10}$ Torr and 750° C. to grow an As-doped, n-conductivity type emitter layer 13. Furthermore, still keeping the high vacuum, a layer 14 of As-doped polycrystalline silicon or amorphous silicon is formed to about 0.3 μm thickness, as shown in FIG. 3(b). Since these steps are made by keeping the high vacuum, there is no fear of forming a natural oxide film between the n-conductivity type emitter layer 13 and the layer 14 of polycrystalline silicon or amorphous silicon. Accordingly the subsequent heat treatment to drive the impurity the layer 14 of polycrystalline silicon or amorphous silicon into the n-conductivity type emitter layer 13 can be made with a high controllability, to achieve uniform impurity concentration of the emitter layer 13 and the layer 14. Since the n-conductivity type emitter layer 13 is formed by the molecular beam epitaxy independently from the forming of the base layer 12, there is no compensation effect between the donor and acceptor in the emitter region as in the conventional emitter region made by the diffusion method. Accordingly, even when the emitter junction is made shallow, there is no shortcoming of decreasing emitter injection efficiency.

Figure 3C:
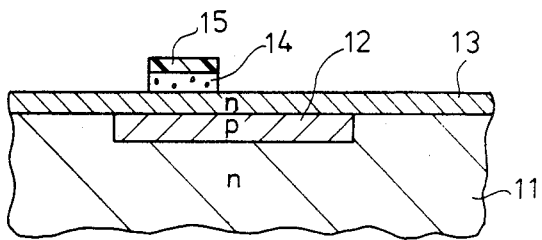

In the next step, as shown in FIG. 3(c), a $Si_3N_4$ film 15 of about 600 Å is formed by a known chemical vapour deposition method on all the face of the wafer, and then by means of photolithographic method, a resist film (not shown) is patterned at a part to become the emitter region, and thereby the $Si_3N_4$ film 15 and underlying polycrystalline silicon layer 14 are etched by known dry etching, for instance, using $CF_4$ gas or $CF_2Cl_2$ gas utilizing the photo resist film as mask. A thereafter the photoresist mask is removed. Then by using the $Si_3N_4$ film 15 as a mask, by means of selective oxidation, an oxide film 16 is formed to a thickness of 0.2 μm. This oxidation is carried out by high pressure oxidation method, for instance, under 6.5 kg/cm² at a relatively low temperature of 800° C. for 45 minutes. It is important that the oxidation is to be made in such a low temperature that the n-conductivity type emitter layer 13 and the underlying base layer 12 hardly change their impurity distribution. Thereafter the $Si_3N_4$ film 15 is removed by hot phosphoric acid thereby to produce a semiconductor device shown in FIG. 3(d).

Figure 3D:
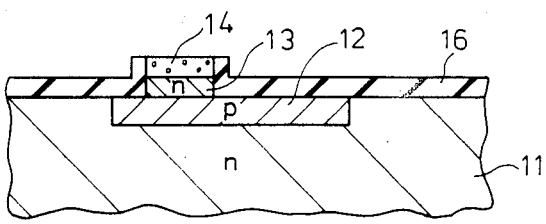

FIG. 4 is a graph showing the impurity concentration profile of the semiconductor device shown in FIG. 3(d). Its abscissa is graduated with depth from the interface between the single crystalline silicon surface and the overriding polycrystalline silicon layer, and the ordinate is graduated with impurity concentration. In the graph, solid curve A shows the impurity concentration profile of As in the emitter, dotted curve B shows the impurity concentration of $B^+$ in the base, and chain line curve C shows the impurity concentration profile of the epitaxial layer as the collector. A point D shows the emitter junction and point E shows the base junction.

Since the emitter region 13 and the overriding polycrystalline silicon layer 14 are formed with uniform impurity concentration by utilizing the molecular beam epitaxy, there is no natural oxide film at the interface therebetween, and accordingly no piling up of As at the interface found. Therefore even a very shallow emitter junction can be formed with good control ability. Moreover, since the emitter region is formed independently from the underlying base region by the molecular beam epitaxy, the donor in the emitter region represented by the region I in FIG. 4 and the acceptor in the base region represented by the region II in the graph of FIG. 4 are completely isolated. Therefore, there is no compensation effect between the donor and acceptor in the emitter region, and hence efficiency of carrier injection from emitter to base is not deteriorated even when a shallow emitter junction is formed. Thus, a high current amplification factor $h_{FE}$ is achievable. Furthermore, since the polycrystalline silicon layer 14 or the amorphous silicon layer is formed on the emitter region 13, even when the emitter region is formed very shallowly, there is no fear that the aluminum electrode will penetrate the emitter region when forming the Al electrode. That is, the penetration of the emitter can be prevented by the polycrystalline silicon layer like the conventional device. Besides, a short life time in the polycrystalline silicon layer of holes injected from the base region to the emitter is assured like the conventional one.

Though in the embodiment of FIG. 3(a)-FIG. 3(d), the device has no oxide film on the surface of the silicon wafer, it is apparent that the present invention is similarly effective for making such a semiconductor device having an oxide film on predetermined regions on the semiconductor surface. The above-mentioned embodiment is the case where forming of up to the base layer is made by conventional known methods and the emitter region and the polycrystalline silicon layer only are formed by the molecular beam epitaxy. But the method in accordance with the present invention has the same advantage when the base, the emitter and the polycrystalline silicon layer are all formed continuously by the molecular beam epitaxy.

Hereafter two embodiments suitable for making bipolar transistors are described.

[Embodiment 2]

Figure 5A:
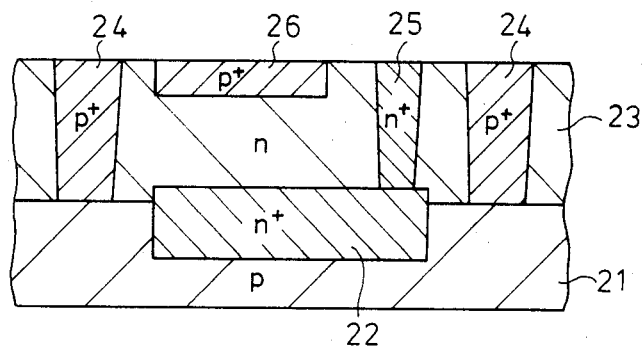
FIG. 5(a), FIG. 5(b), FIG. 5(c), FIG. 5(d) and FIG. 5(e) are sectional elevation views of the essential part of a bipolar transistor made by embodying the present invention.

FIG. 5(a) through FIG. 5(d) show an embodiment of manufacturing a bipolar semiconductor transistor as a preferred actual embodiment. In FIG. 5(a), in a p-conductivity type semiconductor substrate 21, an $n^+$-conductivity type burried layer 22, and an n-conductivity epitaxial layer 23 of 2.0 $\mu$m thickness are formed. Also isolation regions 24 of p-conductivity type are formed to reach the semiconductor substrate part 21. Collector walls are formed by an n-conductivity type semiconductor region 25 and is connected to the buried region 22 of the same $n^+$ type. A base layer 26 of $p^+$-conductivity type is formed to have a thickness of 0.15 $\mu$m, and a sloped impurity concentration profile with highest concentration at the surface part. In the early stage of manufacturing shown in FIG. 5(a), all the oxide film on the surface of the wafer is removed.

Figure 5B:
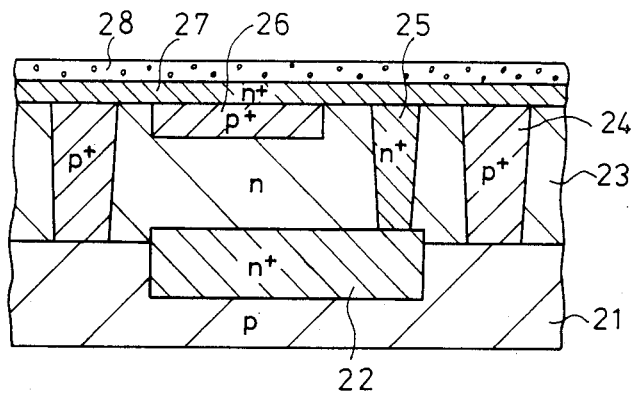

Thereafter, by means of the molecular beam epitaxy method, which is the feature of the present invention, an n-conductivity type emitter layer 27 doped with As of 0.1 $\mu$m thickness is formed under a high vacuum, for instance, $10^{-10}$ Torr and 750° C., and in continuity thereof, keeping the same high vacuum and lowering the temperature to 300°-600° C., a polycrystalline silicon layer 28 or amorphous silicon layer doped with As is formed to a thickness of 0.3 $\mu$m on the emitter layer 27 by the molecular beam epitaxy as in FIG. 5(b). Since these steps are made continuously in the high vacuum state, there is no forming of natural oxidation film at the interface part between the emitter layer 27 and the polycrystalline or amorphous silicon layer 28, and therefore, the impurity concentration can be controlled uniformely. Accordingly, unlike the conventional diffusion method, there is no compensation effect between the donor and acceptor in the emitter region.

Figure 5C:
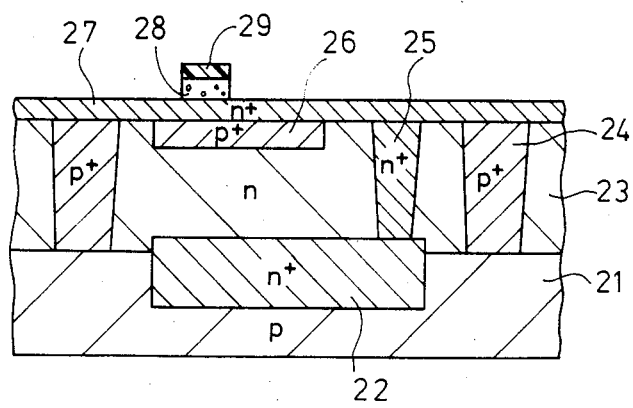
Figure 5D:
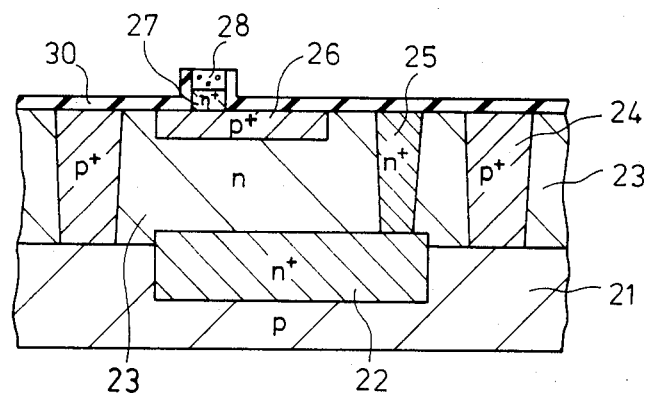

As shown in FIG. 5(c) by means of known an ordinary chemical vapour deposition method, $Si_3N_4$ film 29 is formed on all of the surface to a thickness of about 600 Å, and thereafter by means of a photolithographic method, a photoresist film (not shown) is patterned on a part to become an emitter region. By utilizing the photoresist film as mask, a dry etching is carried out, for instance, using $CF_4$ gas, removing or $CF_2Cl_2$ gas the $Si_3N_4$ film 29 and the underlying polycrystalline or amorphous silicon layer 28, and thereafter the photoresist mask is removed as shown in FIG. 5(c). Thereafter by utilizing the $Si_3N_4$ film 29 as mask, a selective oxidation is carried out, thereby to form oxide film 30 of 0.2 $\mu$m The oxidation is made by a high pressure oxidation method, for instance, under 6.5 kg/cm$^2$ and a low temperature of 800° C. for 45 minutes. Under the low oxidation temperature, the n-conductivity type emitter layer 27 and the base layer 26 hardly change their impurity distribution. Thereafter the $Si_2N_4$ film 29 is removed by using hot phosphoric acid, as shown in FIG. 5(d).

Figure 5E:
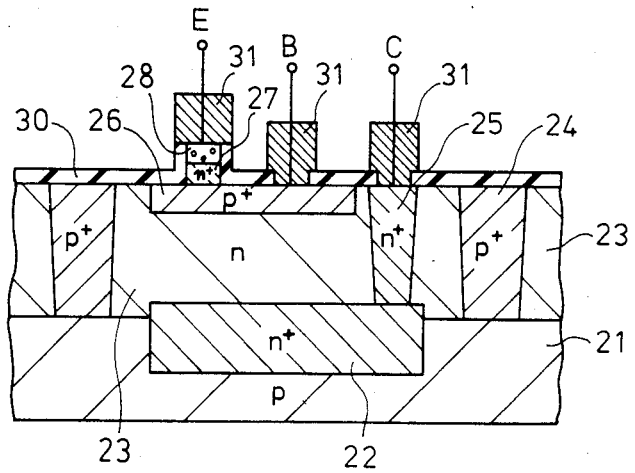

Thereafter as shown in FIG. 5(e), by means of known usual photolithographic method, the base opening and collector contact opening are bored, and aluminum electrode wiring 31 are formed, thereby to complete the bipolar semiconductor of FIG. 5(e).

[Embodiment 3]

Figure 6:
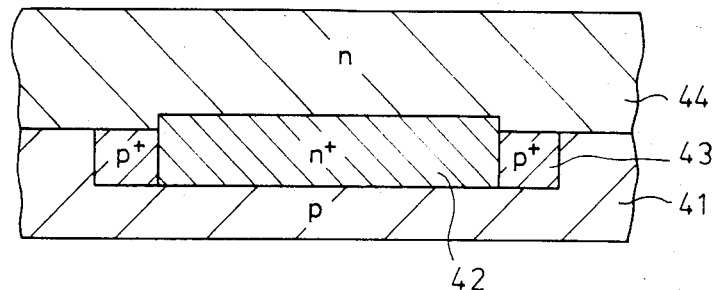
FIG. 6(a), FIG. 6(b), FIG. 6(c), FIG. 6(d), FIG. 6(e) FIG. 6(f), FIG. 6(g), FIG. 6(h) and FIG. 6(i) are sectional elevation views of the essential part of another bipolar transistor made by embodying the present invention.
Figure 6:
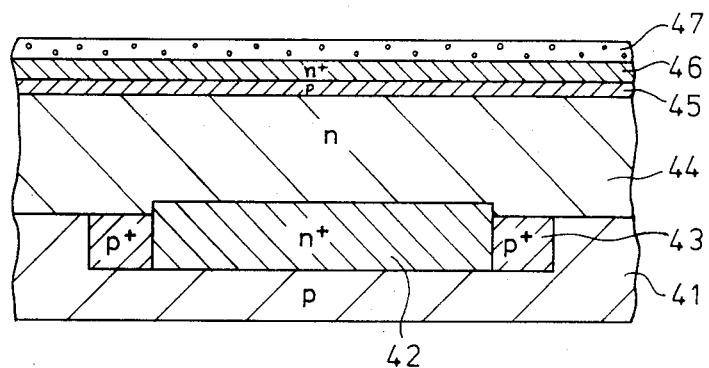
Figure 6:
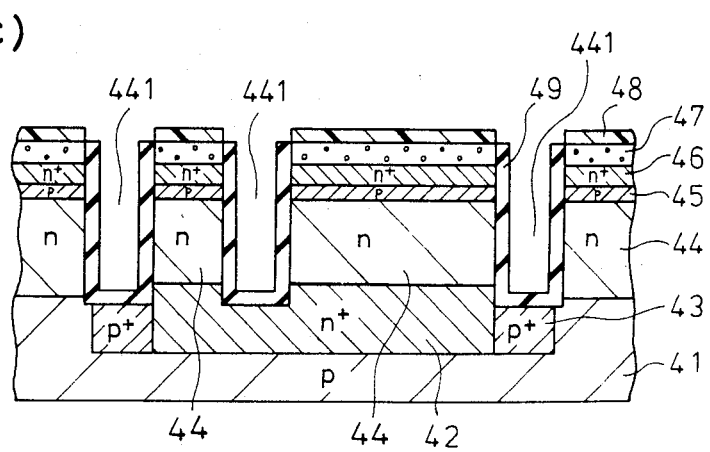

FIG. 6(a) through FIG. 6(i) show another preferred embodiment of making a bipolar transistor embodying the present invention. As shown in FIG. 6(a), on a p-conductivity type semiconductor substrate 41, a burried layer 42 of $n^+$-conductivity type, and channel stopper layers 43 of p-conductivity type are formed in adjacent parts to the buried region 42. On the above-mentioned parts, an n-conductivity type epitaxial layer as a collector layer is formed to a thickness of 0.8 $\mu$m. The above-mentioned step is quite the same as the conventional manufacturing step.

Thereafter, by means of the molecular beam epitaxy method which is a feature of the present invention, under a high vacuum, for instance, $10^{-10}$ Torr and at a temperature of 750° C., a p-conductivity type base layer 45 doped with $B^+$ is grown to a thickness of 0.1 $\mu$m, on the n-conductivity type epitaxial layer. Next, an n-conductivity type emitter layer doped with As is grown to a thickness of 0.1 $\mu$m. Furthermore, by still keeping the high vacuum, the temperature is lowered to 300°-600° C. and As doped polycrystalline silicon or amorphous silicon layer 47 is grown to a thickness of 0.3 $\mu$m on the n-conductivity type emitter layer 46, as shown in FIG. 6(b). Since these steps are carried out continuously in the high vacuum, there is no natural oxidation film formed at the interface between the n-conductivity type emitter layer 46 and the polycrystalline or amorphous silicon layer 47. Furthermore, by using the molecular beam epitaxy, the p-conductivity type base layer 45 can be made so thin as 0.1 $\mu$m and depending on demand, its impurity concentration profile can be made either a sloped profile for increasing drift electric field or a uniform profile. Furthermore the n-conductivity type emitter layer 46 can be grown with a uniform high impurity concentration. Since the p-conductivity type base layer 45 and the n-conductivity type emitter layer 46 are grown independently by the molecular beam epitaxy, there is no compensation effect between the donor and acceptor of the emitter, which was hitherto observed in the conventional emitter region made by the diffusion or ion-implantation method. Therefore, this method can form a very shallow emitter junction and base junction with very good accuracy, and which is thereby high-speed in operation of the transistor.

In the step of FIG. 6(c), $Si_3N_4$ film 48 is formed on all the surface of the wafer to a thickness of 0.1 µm, and thereafter by means of a known photolithographic method a photoresist film pattern is formed, and by using the photoresist film as mask, a dry etching is carried out, for instance, by using $CF_4$ gas or $CF_2Cl_2$ gas, thereby to form openings 441 by removing the $Si_3N_4$ film 48, polycrystalline silicon film 47, n-conductivity type emitter layer 46, p-conductivity type base layer 45 and n-conductivity type epitaxial layer 44 in continuity, in a manner to form the openings 441 reaching to a of 0.1–0.3 µm from the upper face of the p-conductivity type semiconductor substrate 41. Thereafter, the photoresist film is removed, and by using $Si_3N_4$ film 48 which remains on the surface of the wafer, oxide film 49 of about 0.2 µm thickness is formed in the inner wall of the openings 441. The oxidation step for making the oxide film 49 is made by a high pressure oxidation method carried out under a relatively low temperature of 800° C. and a high pressure of 6.5 kg/cm² for about 45 minutes. The above-mentioned temperature does not substantially change impurity distributions of the p-type base layer 45 and n-type emitter layer 46 made by the molecular beam epitaxy. Since a shallow emitter junction and base junction are formed by the molecular beam epitaxy, it is important that the process hereafter should be carried out in such a low temperature that impurity distrubutions of As in the emitter layer and $B^+$ in the base layer do not substantially change.

Figure 6D:
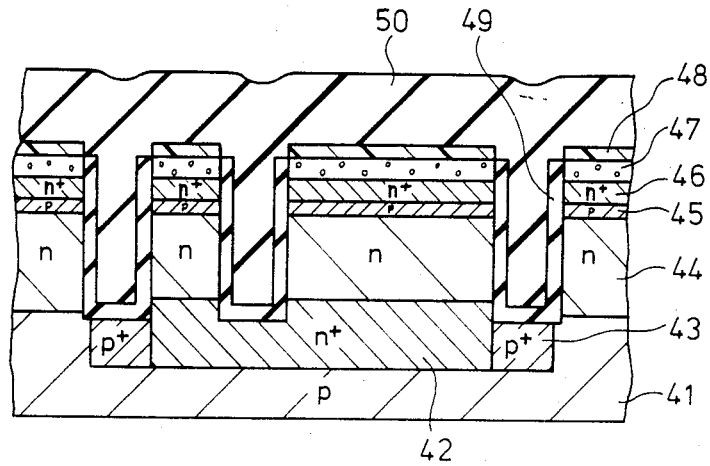

Thereafter, in order to fill the openings 441 $SiO_2$ film 50 is deposited on all of the surface of the wafer by a known chemical vapor deposition method to a thickness of about 1.5 µm at the part of the flat surface of the wafer. When the size of the openings 441 is within about 3 µthe $SiO_2$ film 50 of the chemical vapor deposition can completely vary fill the openings, thereby making an even surface as shown in FIG. 6(d).

Figure 6E:
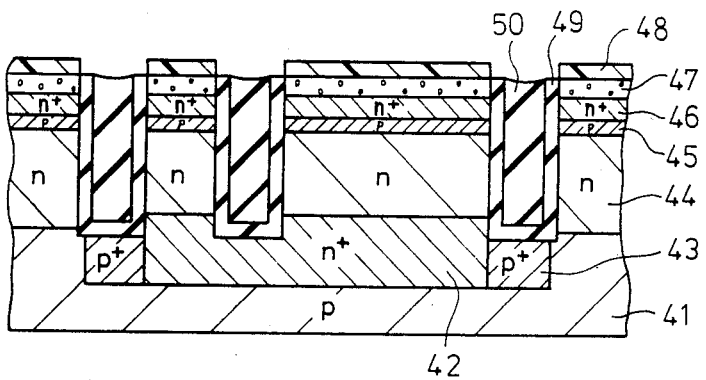
Figure 6F:
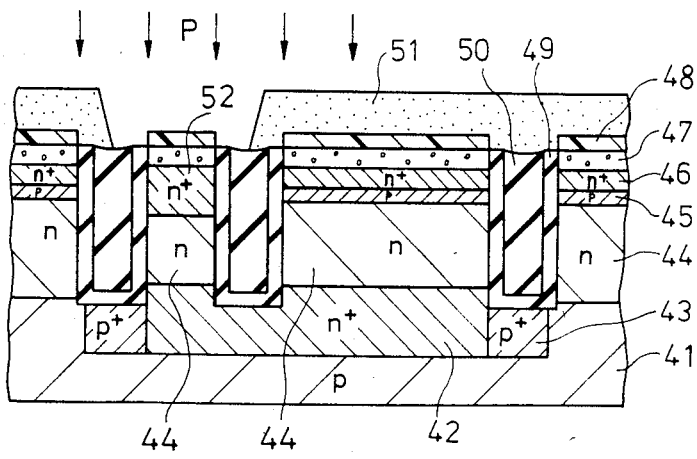

Thereafter, as shown in FIG. 6(e) another dry etching is carried out on all the face of the wafer by using for instance $C_3F_8$ gas or $C_4F_8$ gas, thereby to remove the chemical-vapor-deposited $SiO_2$ film 50 so that the $Si_3N_4$ film 48 is exposed. And subsequently, by using $Si_3N_4$ film 48 as a mask, a surface of the chemical vapor deposited $SiO_2$ film 50 is further oxidized to change into a thermal oxidation film of more dense nature. The oxidation is made by a high pressure oxidation method under a high pressure of 6.5 kg/cm² and a low temperature of 800° C. for about 30 minutes. Thereafter, by means of a known usual photolothographic method, a photoresist film 51 is formed with a predetermined pattern, in a manner that ion implantation of P is made only to a part to become the collector contact, so that a part of the p-type base region 45, formed at the region to become the collector contact part, is changed to an n-conductivity type region to serve as a collector contact region 52, as shown in FIG. 6(f).

Figure 6G:
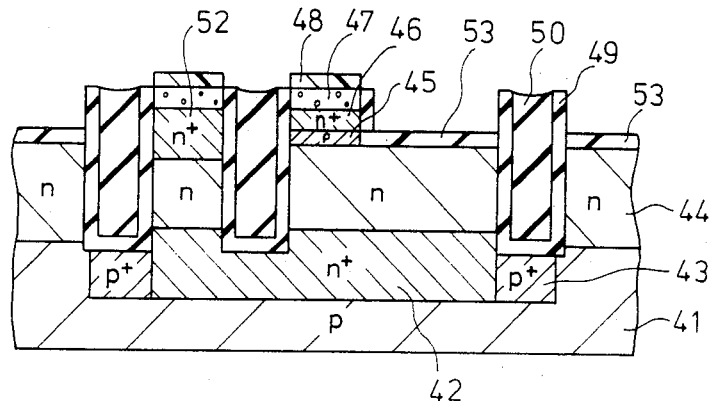

Then as shown in FIG. 6(g), after removal of the photoresist film 51, another photoresist film is formed by known a photolithographic method only on the emitter region and collector contact region. By using this new photoresist film 51, the $Si_3N_4$ film 48, polycrystalline silicon layer 47, n-conductivity type emitter layer 46 which are formed on the part of inactive base region and the field part are removed by known dry etching method, for instance, by using $CF_4$ gas or $CF_2Cl_2$ gas. Then, after removing the latter photoresist film, by using the $Si_3N_4$ 48 retained on the emitter region and the collector contact region as a mask, another oxide film 53 is formed on the side faces of the emitter region and the parts on the inactive base and on the field part to a thickness of 0.2 µm. Of course a high pressure oxidation method was used under 6.5 kg/cm² and a low temperature of 800° C. for about 45 minutes. Thereafter, the $Si_3N_4$ film 48 is removed by a known method. At this time, the polycrystalline silicon layer 47 is retained only on the emitter region and the collector contact part, and all the other parts of the wafer are covered with the oxide film.

Figure 6H:
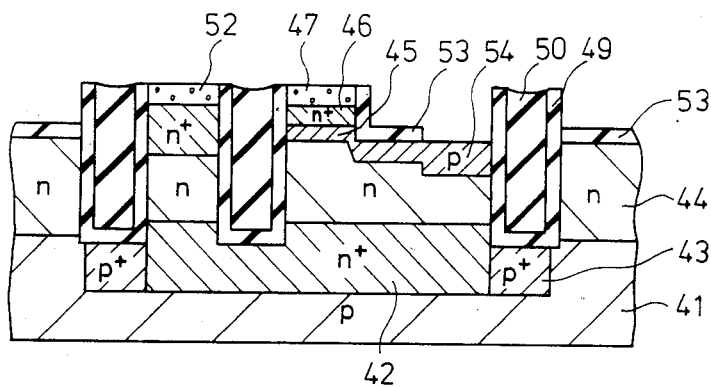
Figure 6I:
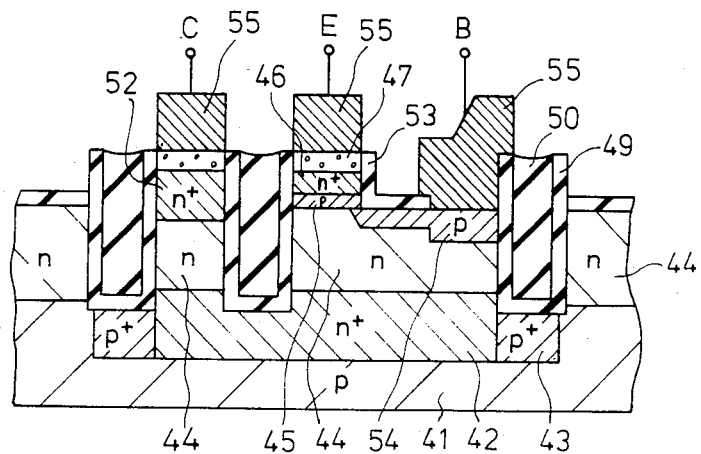

Then by means of the photolithographic method, the oxide film 53 only on the part of the base contact part is removed by chemical etching using a mixed solution of $NH_4F$: $HF = 10:1$. On all the surface of the wafer $B^+$ ions are ion implanted by 60 KeV energy with a dose of $1 \times 10^{15}$ atom/cm². By means of the ion implantation, a high concentration inactive base region 54 is formed extending from the end of the emitter region 46 in self alignment. Since the polycrystalline silicon 47 of 0.3 µm thickness contains a high concentration As, the $B^+$-ions implanted over the emitter are all trapped by the As ions in the polycrystalline silicon and hardly move, thereby making no effect on the impurity concentration in the n-conductivity type emitter region 46, as shown in FIG. 6(h). Thereafter, aluminum electrodes 55 are formed on the base contact and on the polycrystalline silicon layers 47, on the emitter region 46 and the collector contact 52, and the bipolar transistor is completed.

As has been described, according to the present invention by utilizing molecular beam epitaxy, the emitter region and polycrystalline silicon layer are continuously grown in a high vacuum. Therefore, a very shallow emitter junction can be formed with a good controllability. Since the emitter region is formed by the molecular beam epitaxy method independently from other region, the hitherto inevitable adverse compensation effect between donor and acceptor in the emitter region can be eliminated. Accordingly even when the emitter junction is very shallow, the efficiency of carrier injection from the emitter to the base is not lowered, and the current amplfication factor $h_{FE}$ can be raised, and the high speed operation of the bipolar transistor is achievable.

Furthermore, since the emitter region and the polycrystalline silicon layer are grown in a continuous steps by the molecular beam epitaxy, there is no fear of growing a natural oxide film at the interface between the emitter region and the polycrystalline silicon layer, and satisfactory controllability of the amplification factor $h_{FE}$ is obtainable; thereby the production yield of the semiconductor device is increased. Since the polycrystalline silicon layer is formed on the semiconductor wafer, even when the emitter junction is very shallow, there is no fear of penetration of the aluminum electrode through the emitter region. Moreover, since the life time of the holes injected from the base to the polycrystalline silicon layer is short, this attributes to a high $h_{FE}$ value. Instead of the above-mentioned embodiment, the molecular beam epitaxy for continuous forming of layers can be used for forming the base layer, the emitter layer and the polycrystalline silicon layer or amorphous silicon layer, all continuously without breaking the high vacuum. As has been described, by the use of the molecular beam epitaxy method, the formation of a very shallow emitter junction is possible. By formation of a polycrystalline or amorphous silicon layer covering the surface of the wafer, a high speed operation and large integration as well as satisfactory controllability of $h_{FE}$ can be obtainable in accordance with the present invention.

What is claimed is:

1. Method for making a semiconductor device comprising at least the steps of;
    forming a first emitter layer of single-crystalline semiconductor;
    forming a second emitter layer of polycrystalline or amorphous semiconductor on said first layer, said first and second emitter layers being continuously formed by means of molecular beam epitaxy without forming an oxide film therebetween;
    forming an anti-oxidation layer on said second emitter layer;
    forming a pattern by etching said first and second emitter layers; and
    forming an oxide layer for at least surrounding side portions of said first and second emitter layers by use of said anti-oxidation layer as a mask.

2. The method for making a semiconductor device in accordance with claim 1, wherein
    said second emitter layer of a polycrystalline or amorphous semiconductor is doped with an impurity.

3. The method for making a semiconductor device in accordance with claim 2, wherein said impurity is As.

4. Method for making a semiconductor device in accordance with claim 1, wherein said anti-oxidation layer is $Si_3N_4$ film.

5. Method for making a bipolar transistor comprising at least the steps of:
    forming an emitter layer of a single-crystalline semiconductor;
    forming an upper layer of polycrystalline or amorphous semiconductor on said emitter layer, said emitter and upper layers being continuously formed by means of molecular beam epitaxy so that said upper layer is directly formed on said emitter layer without an interface of oxide film therebetween, and forming an oxide layer for at least surrounding side portions of said emitter and upper layers.

6. The method for making a bipolar transistor in accordance with claim 5, wherein
    said layer of polycrystalline or amorphous semiconductor is doped with an impurity.

7. The method for making a bipolar transistor in accordance with claim 6, wherein
    said impurity is As.

8. Method for making a semiconductor device comprising at the least steps of:
    on a substrate of single crystalline semiconductor of one conductivity type, forming a first layer of a single crystal of the other conductivity type, a second layer of a single crystal of said one conductivity type and a third layer of a polycrystalline semiconductor or amorphous semiconductor, said forming being made by means of molecular beam epitaxy so that said layers are directly formed on said substrate without an interface oxide film therebetween;
    forming an anti-oxidation layer on said third layer;
    forming a pattern with openings by etching said layers; and
    forming an oxide layer for burying said openings by use of said anti-oxidation layer as a mask.

9. Method for making a semiconductor device in accordance with claim 8, wherein
    said substrate of single crystalline semiconductor of said one conductivity type is made collector,
    said one layer of single crystal of said the other conductivity type is made base, and
    said another layer of single crystal of said one conductivity type is made emitter.

10. Method for making a semiconductor device in accordance with claim 8, wherein
    said layer of polycrystalline semiconductor or amorphous semiconductor is doped with an impurity.

11. Method for making a semiconductor device in accordance with claim 10, wherein
    said impurity is As.

12. Method for making a semiconductor device in accordance with claim 8, wherein said anti-oxidation layer is $Si_3N_4$ film.

* * * * *